(12) United States Patent
Tu

(10) Patent No.: US 6,578,514 B2
(45) Date of Patent: Jun. 17, 2003

(54) MODULAR DEVICE OF TUBULAR PLASMA SOURCE

(75) Inventor: David Tu, Taipei (TW)

(73) Assignee: Duratek Inc., Hsin Chu (TW)

( * ) Notice: Subject to any disclaimer, the term of this patent is extended or adjusted under 35 U.S.C. 154(b) by 72 days.

(21) Appl. No.: 09/867,653

(22) Filed: May 31, 2001

(65) Prior Publication Data

US 2002/0005253 A1 Jan. 17, 2002

(30) Foreign Application Priority Data

Jul. 13, 2000 (CN) .......................................... 089114043

(51) Int. Cl.⁷ ............................................... C23C 16/00
(52) U.S. Cl. ........................... 118/723 AN; 118/723 IR; 118/723 I; 156/345.48
(58) Field of Search .................. 156/345.48; 118/723 I, 118/723 IR, 723 AN

(56) References Cited

U.S. PATENT DOCUMENTS 5,653,811 A * 8/1997 Chan ........................ 118/723 I
5,907,221 A * 5/1999 Sato et al. ............... 315/111.51
6,273,022 B1 * 8/2001 Pu et al. .................... 118/723 I

* cited by examiner

Primary Examiner—Benjamin L. Utech
Assistant Examiner—Sylvia R. MacArthurs
(74) Attorney, Agent, or Firm—Troxell Law Office PLLC

(57) ABSTRACT

A modular device of tubular plasma source mainly includes at least two tubular antennae, one RF power supply and one reference potential. The tubular antennae are arranged side by side for inducing plasma. Each tubular antenna includes an induction coil being a spiral spring shape, and a dielectric sleeve having a hollow through hole for putting in the induction coil. The RF power supply connects with the induction coil in parallel or in series, the reference potential refers to the RF power supply and connects with the induction coil.

16 Claims, 3 Drawing Sheets

MODULAR DEVICE OF TUBULAR PLASMA SOURCE

FIELD OF THE INVENTION

The present invention relates to a modular device of tubular plasma source, and more particularly to an inductively coupled high density plasma reactor used in the manufacture of product such as liquid crystal display panel (such as TFT LCD, TN LCD, STN LCD, etc).

BACKGROUND OF THE INVENTION

In general, plasma source device of high density-plasma system mainly has two kinds: microwave coupled plasma and inductively coupled plasma. The antenna used in inductively coupled plasma is disclosed in Republic Of China in Taiwan's patent publication No. 345677 (the same as U.S. Pat. No. 5,897,712), which includes a cylindrical spiral coil, a flat plate spiral coil, a dome-shaped spiral coil or a complex coil with several foregoing kinds. It's design purpose is aimed principally to handle a disk-like semiconductor wafer, thus generally with the antenna set by winding around the cylindrical sidewall or set on the top surface of a dome shaped reactor, so that it is not suitable for processing large or rectangular plate substrate, such as liquid crystal display substrate.

Furthermore, in a plasma processing chamber for big-sized substrate, conventional coil antenna of plasma reactor without modular design needs to be made case by case according to different size of the chamber, and it is difficult to control the uniformity of generated plasma on such substrate. So it is necessary that a uniformity control device or further an auxiliary inductively coupled coil should be installed accompanying with the main coil antenna for uniformity rectification or compensation.

SUMMARY OF THE INVENTION

The first object of the present invention is to provide a modular device of tubular plasma source with tubular antennae. By means of variety and unlimited connecting disposition of tubular antennae and radio frequency (RF) power supply, the construction of the high density plasma for treatment of different size substrates can be modulized.

The second object of the present invention is to provide a modular device of tubular plasma source. By means of freely adjusting the interval between tubular antennae and by adopting different coil diameter or coil density for each tubular antenna to generate an uniform plasma density or a variably partial-adjustable plasma density while plasma treating.

The third object of the present invention is to offer a tubular antenna unit. The tubular antenna includes an induction coil being a spiral spring shape and a dielectric sleeve for enclosing the induction coil to assemble into a modular device of plasma source.

The forth object of the present invention is to supply a plasma processing chamber with modular device of plasma source. While installing a multiple modular device of tubular plasma source, it will enable uniformly and completely or variably and partially processing square, rectangular or large substrates.

The modular device of tubular plasma source according to the present invention mainly includes at least two tubular antennae, a RF power supply and a reference potential. The tubular antennae are set side by side for plasma generation, each tubular antenna comprises an induction coil being a spiral spring shape and a dielectric sleeve having a hollow through hole for putting in the induction coil. The RF power supply connects with the induction coils in parallel or in series. The reference potential refers to the RF power supply and connects with the induction coils.

DETAILED DESCRIPTION OF THE PREFERRED EMBODIMENTS

Figure 1:
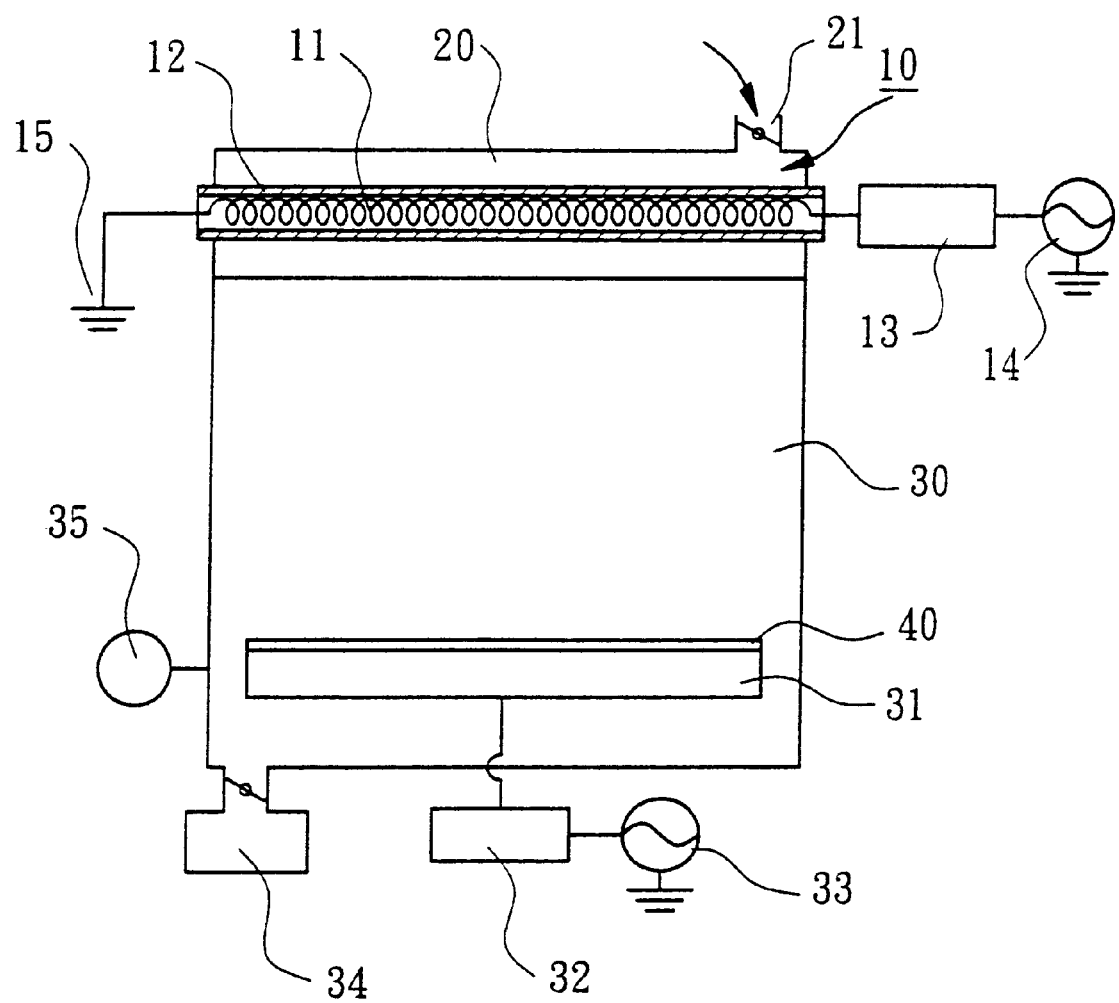
FIG. 1 is a cross sectional view of a plasma reactor incorporating tubular antennae and a RF power supply in accordance with the present invention.

Referring to the attached drawings, the present invention will be described by means of embodiments below:

As shown in FIG. 1, the modular device of tubular plasma source in accordance with the present invention mainly includes at least two tubular antennae 10, a RF power supply 14 and a reference potential 15.

The tubular antenna 10 chiefly comprises an induction coil 11 and a dielectric sleeve 12. The induction coil 11 being a spiral spring shape has a function of increasing inductance to generate plasma. The dielectric sleeve 12 is a hollow through tube, which diameter is about 10–100 mm. The dielectric sleeve 12 is employed to put in the induction coil 11 and made of dielectric material such as quartz or aluminum oxide, etc. Thus the dielectric sleeve 12 has the effect of convenient movement for adjusting and protection of the induction coil 11.

The RF power supply 14 is an alternating current connecting to induction coils 11 of the tubular antennae 10 in parallel or in series with adjustable middle and high frequency from 100 KHz to 40 MHz. By the oscillation of electron in the radio frequency electrical field, the plasma gas in the processing chamber is activated to form high density plasma ($10^{11}$–$10^{12}$ cm$^{-3}$). The reference potential 15 is at ground potential preferably, which refers to the RF power supply 14 and connects to the induction coils 11.

Furthermore, the modular device of tubular plasma source of the present invention further includes a matching network 13 corresponding to RF power supply 14 and connecting between RF power supply 14 and the induction coil 11.

In the present invention, the quantities of tubular antenna elements 10 and RF power supply 14, etc are unlimited, but tubular antenna 10 should be at least two set and RF power supply 14 should be at least one set. The tubular antennae module 10 are arranged side by side mutually parallel and electrically connected with RF power supply 14 to establish a plasma source covering a large or rectangular plate-shaped area. When turning RF power supply on, an uniform and rectangular-shaped plasma distribution corresponding to a rectangular substrate 40 can be generated in a rectangular-shaped plasma reactor in which uncovered or uneven area is totally eliminated during treating the rectangular substrate 40. And it applies to a variety of plasma processes for rectangular substrate 40 treatment such as Plasma Enhanced Chemical Vapor Deposition (PECVD), Physical Vapor Deposition (PVD), Etching, Sputtering and Photo-resist-removing, etc.

Figure 2:
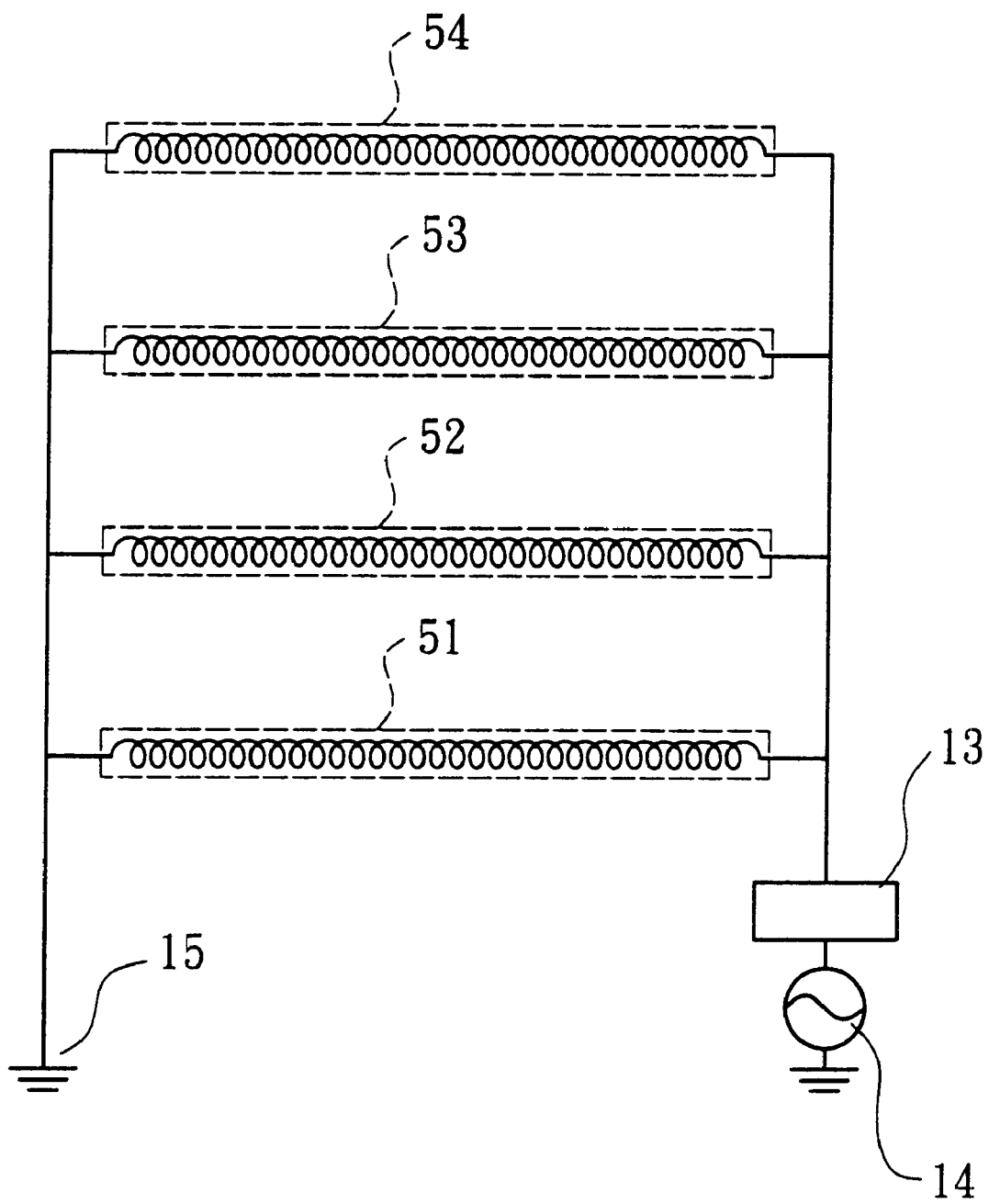
FIG. 2 is a circuit connection diagram of the tubular antennae and the RF power supply in accordance with the first embodiment of the present invention.
Figure 3:
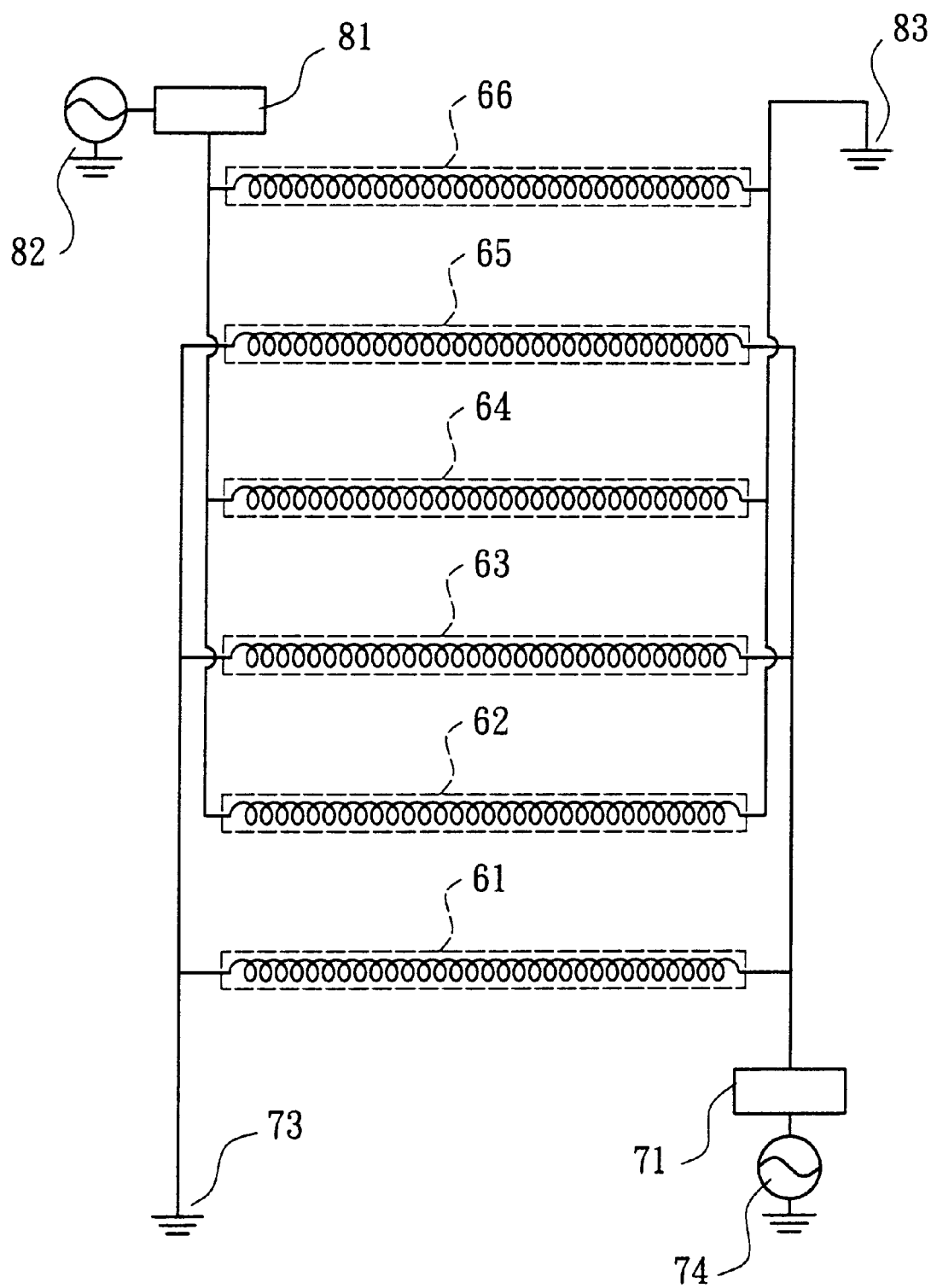
FIG. 3 is a circuit connection diagram of the tubular antennae and the RF power supplies in accordance with the second embodiment of the present invention.

The circuit connection of tubular antennae and RF power supply for processing small-sized substrate is as shown in FIG. 2. First choosing four tubular antennae 51, 52, 53, 54 (illustrated similar to the tubular antenna 10)and a RF power supply 14. The tubular antennae 51, 52, 53, 54 are side by side mutually parallel arranged, with one end of all the tubular antennae 51, 52, 53, 54 connected with the RF power supply 14, with another end of the tubular antennae 51, 52, 53, 54 connected with a reference potential 15. And the interval between two adjacent tubular antennae is adjustable to gain required and proper uniformity of plasma distribution. Furthermore, it is easy to replace the tubular antennae 51, 52, 53, 54 with different coil density or diameter to form a modular device of plasma source for a small-sized plasma processing chamber. Besides, while processing bigger-sized substrate, as showed in FIG. 3, choosing six tubular antennae 61, 62, 63, 64, 65, 66 or even more and two or more RF power supplies 72, 82, the tubular antennae 61, 62, 63, 64, 65, 66 and two RF power supplies 72, 82 are circuit connected in cross style, i.e., connecting the first RF power supply 72 with ends of the same tubular antennae 61, 63, 65 and connecting a reference potential 73 with another ends of the same tubular antennae 61, 63, 65 respectively, simultaneously connecting the second RF power supply 82 with ends of the tubular antennae 62, 64, 66 and connecting another reference potential 83 with another ends of the tubular antennae 62, 64, 66 respectively. Thus a modular device of plasma source applying to bigger-sized plasma processing chamber is formed. Both RF power supplies 72 and 82 in parallel connect with the tubular antennae 61, 63, 65, 62, 64, 66 with interminglement and are located at different sides will form better inductive plasma uniformity.

As showed in FIG. 1, the modular device of tubular plasma source according to the present invention is installed in a plasma processing chamber to plasma-treat a rectangular substrate like liquid crystal display substrate (TFT LCD, TN LCD, STN LCD) or other substrate (such as FED, EL), etc, or semiconductor wafer, etc. The size of the glass substrate for existing generation is 680×880 mm². The plasma processing chamber of the present invention may extensively be used for Physical Vapor Deposition, Chemical Vapor Deposition and Etching, etc. The plasma processing chamber of the present invention at least comprises: a processing chamber, a vacuum pump 34, a pedestal 31, a bias RF power supply 33, a bias matching network 32 and a modular device of tubular plasma source.

The processing chamber consisting of an upper Camber body 20 and a lower chamber body 30, wherein the upper chamber body 20 has a gas inlet 21 for entering of suitable precursor gas such as oxygen, carbon tetrafluoride, silane, and TEOS, etc. The vacuum pump 34 is installed below the lower chamber body 30, used to discharge gas and reduce pressure down to between 1 m Torr and 100 Torr suitable for plasma generating. As usual, there is a vacuum gauge 35 for detecting the pressure. The pedestal 31 is installed in the lower chamber 30 for carrying the substrate 40.The bias RF power supply 33 and a matching network 32 connect with pedestal 31 to bias the substrate during processing. The modular device of tubular plasma source is installed in the upper chamber body 20, chiefly comprises at least two tubular antennae 10, a RF power supply 14 and a reference potential 15. The tubular antennae 10 are arranged side by side as plasma source, each tubular antenna 10 includes an induction coil 11 like a spiral spring and a dielectric sleeve 12 for accommodating the induction coil 11. The RF power supply 14 connects with induction coils 11 in parallel or in series. The reference potential 15 refers to RF power supply 14 and connects with induction coils 11. Thus it is able to handle a big-sized rectangular substrate with uniform plasma distribution, particularly for liquid crystal display substrate. Installing necessary devices and under appropriate process conditions, the plasma processing chamber can be used for various purposes. The modular device of tubular plasma source according to the present invention can be installed in a plasma processing chamber with a module type for uniformly and completely, or, variably and partially processing a big-sized rectangular substrate.

The above description of embodiment of the present invention is intended to be illustrative and is not limited herein. Other embodiments of the present invention will be obvious to those skilled in the art in view of the above disclosure.

What is claimed is:

1. A modular device of tubular plasma source in a plasma processing chamber, comprising:
   at least two tubular antennae arranged side by side for inducing plasma, wherein each tubular antenna comprises an induction coil having a spiral spring shape, each tubular antenna including a dielectric sleeve having a hollow through hole accommodating the induction coil;
   at least a RF power supply connected with the induction coils; and
   at least a reference potential referring to the RF power supply and connected with the induction coil.

2. The modular device of tubular plasma source of claim 1, wherein the RF power supply includes a matching network.

3. The modular device of tubular plasma source of claim 1, wherein the reference potential is a ground potential.

4. The modular device of tubular plasma source of claim 1, wherein the dielectric sleeve is made of a dielectric material selected from the group consisting of quartz and aluminum oxide.

5. The modular device of tubular plasma source of claim 1, wherein all the tubular antennae are arranged mutually parallel.

6. A tubular antenna for connecting with RF power supply for inducing plasma, comprising:
   a dielectric sleeve having a hollow through hole; and
   an induction coil having a spiral spring shape and located in the dielectric sleeve.

7. The tubular antenna of claim 6, wherein the dielectric sleeve is made of a dielectric material selected from the group consisting of quartz and aluminum oxide.

8. A plasma processing chamber, comprising:
   a processing chamber including an upper chamber body and a lower chamber body, wherein the upper chamber body has a gas inlet;
   a pedestal installed in the lower chamber body for holding a substrate;
   a vacuum pump connected to the lower chamber body for discharging a gas in the processing chamber; and
   a modular device of tubular plasma source disposed in the upper chamber body, and comprising at least two tubular antennae, one RF power supply and one reference potential, wherein the tubular antennae are arranged side by side in parallel for inducing plasma, each tubular antenna at least includes an induction coil having a spiral spring shape, the RF power supply being connected to the induction coil, and the reference potential is referred to the RF power supply and connected to the induction coil.

9. The plasma processing chamber of claim 8, wherein there are at least two sets of RF power supplies alternately connected to induction coils of the tubular antennae.

10. The plasma processing chamber of claim 8, wherein the RF power supply includes a matching network.

11. The plasma processing chamber of claim 8, wherein the reference potential is a ground potential.

12. The plasma processing chamber of claim 8, wherein the tubular antenna includes a dielectric sleeve having a hollow through hole accommodating the induction coil.

13. The plasma processing chamber of claim 12, wherein the dielectric sleeve is made of dielectric material selected from the group consisting of quartz and aluminum oxide.

14. The plasma processing chamber of claim 8, further comprising a bias RF power supply connected to the pedestal.

15. The plasma processing chamber of claim 14, further comprising a bias matching network connected to the bias RF power supply.

16. The plasma processing chamber of claim 8, wherein the pedestal holds a liquid crystal display substrate.

* * * * *